US007757959B2

(12) United States Patent
Kim et al.

(10) Patent No.: US 7,757,959 B2
(45) Date of Patent: Jul. 20, 2010

(54) SYSTEM-IN-PACKAGE HAVING REDUCED INFLUENCE BETWEEN CONDUCTOR AND ANTENNA AND METHOD OF DESIGNING THE SAME (75) Inventors: Joungho Kim, Daejeon (KR); Gawon Kim, Pohang-si (KR); Chung Hyun Ryu, Daejeon (KR)

(73) Assignee: Korea Advanced Institute of Science and Technology, Daejeon-si (KR)

( * ) Notice: Subject to any disclaimer, the term of this patent is extended or adjusted under 35 U.S.C. 154(b) by 0 days.

(21) Appl. No.: 11/951,715

(22) Filed: Dec. 6, 2007

(65) Prior Publication Data
US 2008/0149736 A1    Jun. 26, 2008

(30) Foreign Application Priority Data
Dec. 21, 2006    (KR) .................. 10-2006-0131945

(51) Int. Cl.
*G06K 19/06*    (2006.01)
(52) U.S. Cl. ................................... 235/492
(58) Field of Classification Search ................ 235/492, 235/488; 257/679; 29/827, 840, 846
See application file for complete search history.

(56) References Cited

U.S. PATENT DOCUMENTS

| 6,637,665 | B2* | 10/2003 | Salzgeber | 235/492 |
| 6,830,193 | B2* | 12/2004 | Tanaka | 235/492 |
| 7,202,821 | B2* | 4/2007 | Fujikawa et al. | 343/700 MS |
| 7,261,240 | B2* | 8/2007 | Akiho et al. | 235/492 |
| 2005/0052323 | A1* | 3/2005 | Shikata | 343/700 MS |
| 2007/0145155 | A1* | 6/2007 | Scarlatella | 235/492 |

FOREIGN PATENT DOCUMENTS

| KR | 10-2004-0070312 | 8/2004 |
| KR | 10-2006-0008332 | 1/2006 |

* cited by examiner

*Primary Examiner*—Daniel A Hess
*Assistant Examiner*—Tabitha Chedekel
(74) *Attorney, Agent, or Firm*—H.C. Park & Associates, PLC (57) ABSTRACT The present invention relates to a SiP having reduced influence between a conductor and an antenna, and a method of designing the SiP. The SiP includes an antenna configured to function to transmit or receive data and mounted in the SiP to be integrated in the SiP, and a first planar conductor having at least one slit formed therein. Therefore, the present invention minimizes the amount of current or electromagnetic field induced on the conductor by the current or electromagnetic field of the antenna, thus reducing the influence of the conductor on the operating characteristics of the antenna.

4 Claims, 16 Drawing Sheets

Top Layer (1st)

Bottom Layer (4th)

Ground Layer (2nd)

Power Layer (3th)

SYSTEM-IN-PACKAGE HAVING REDUCED INFLUENCE BETWEEN CONDUCTOR AND ANTENNA AND METHOD OF DESIGNING THE SAME

BACKGROUND OF THE INVENTION

1. Field of the Invention

The present invention relates, in general, to a System-in-Package (SiP) having reduced influence between a conductor and an antenna, and a method of designing the SiP, and, more particularly, to a SiP, which can reduce the influence of a planar conductor on the operating characteristics of an antenna in a SiP in which the antenna is integrated, and a method of designing the SiP.

2. Description of the Related Art

Recently, in mobile devices, such as mobile phones and Personal Digital Assistants (PDAs), technology for System-in-Package (SiP), in which various systems and passive devices are implemented in the form of a single package to realize the small size of the mobile devices, and in which an antenna for data transmission/reception is also integrated in the package, has been variously used.

For example, a Radio-Frequency Identification (RFID) system has been widely used for traffic cards, entrance control cards, etc. Recently, a mobile RFID system has been standardized, and the necessity to mount an RFID reader in a mobile device has increased, so that the importance of SiP technology has gradually increased in order to reduce the size of a large RFID reader.

Figure 1:
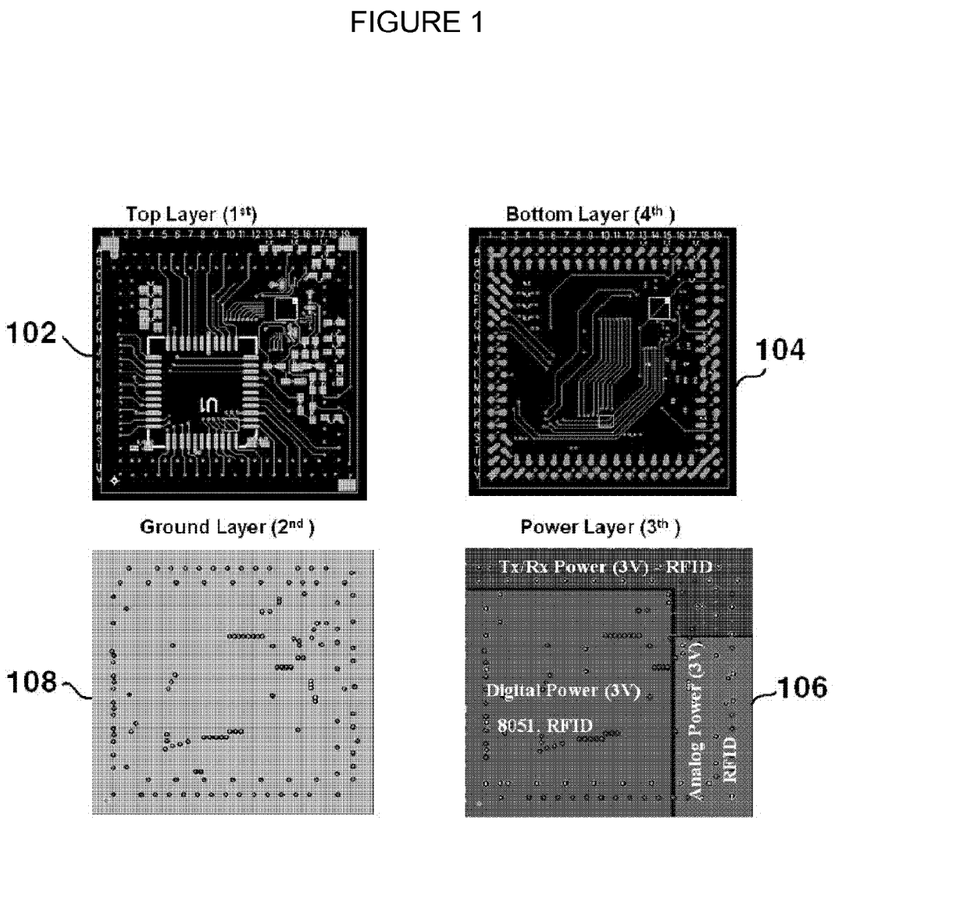
FIG. 1 is a view showing the structure of a conventional RFID reader package.

FIG. 1 is a view showing the structure of a conventional RFID reader package.

As shown in FIG. 1, an RFID reader package is typically implemented in a four-layer structure. That is, the RFID reader package is composed of a top layer 102, on which a plurality of chips and passive devices is mounted, a bottom layer 104 connected to ball or lead frames required to mount the package on a test board, a power layer 106 for supplying power to the chips and devices in the package, and a ground layer 108 for grounding.

In typical cases, as shown in FIG. 1, conductors for supplying power and providing ground are formed both on the power layer 106 and on the ground layer 108 in the shape of planes, rather than lines, in order to realize power integrity.

The term 'power integrity' means the pure and stable supply of the power and ground to prevent noise from occurring in the power and the ground. In order to stably supply power and provide ground, which are Direct Current (DC) voltages, and to decrease DC loss, it is preferable that a power conductor and a ground conductor be implemented in the shape of small planes, having a low impedance value, rather than the shape of lines, having a high impedance value, from the standpoint of power integrity.

Figure 2A:
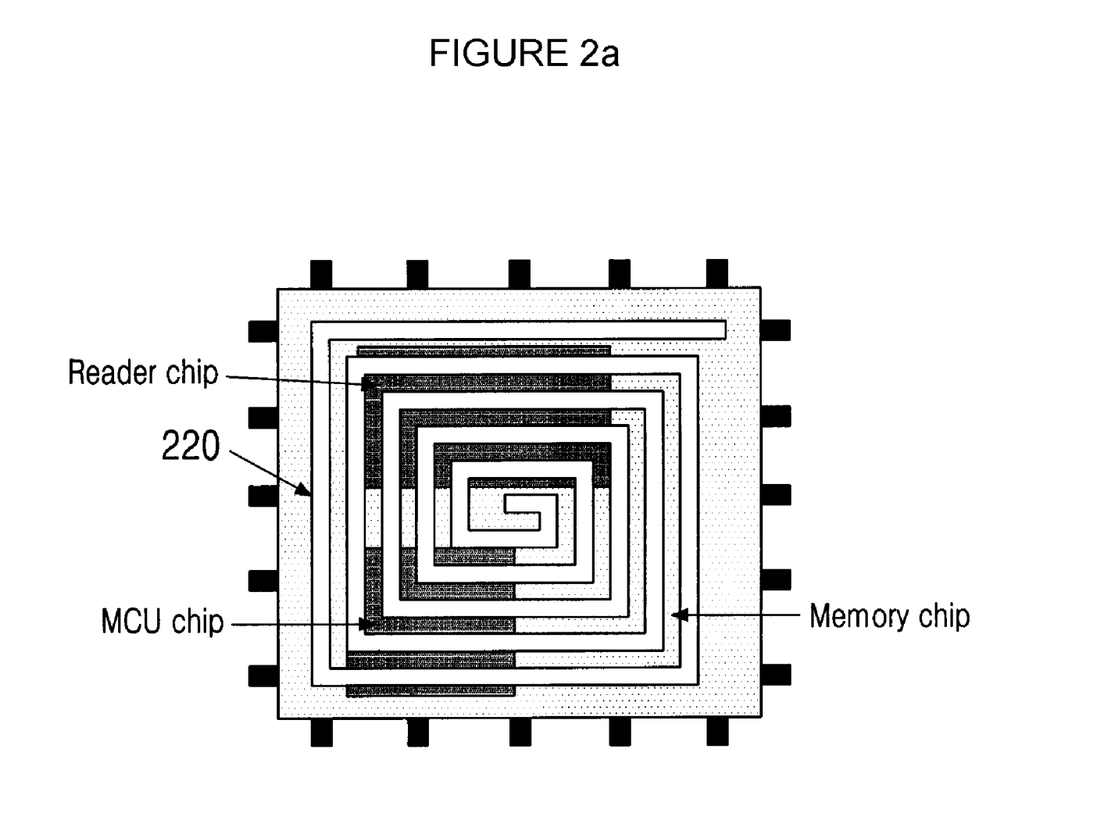
FIGS. 2A and 2B are views showing an example in which a conventional RFID reader, in which an antenna is also integrated, is implemented in the form of a SiP.
Figure 2B:
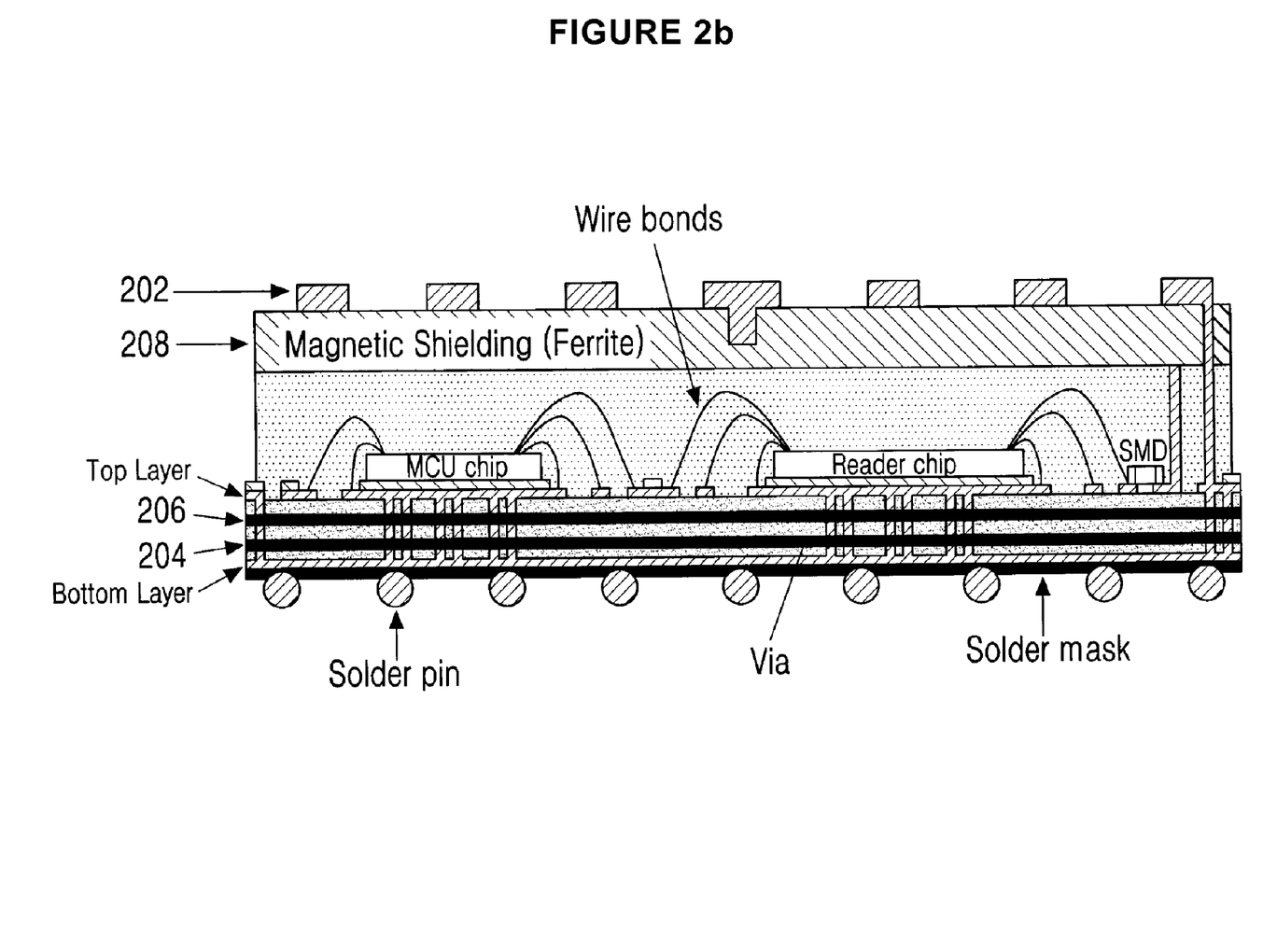

FIGS. 2A and 2B are views showing an example in which a conventional RFID reader, in which an antenna is also integrated, is implemented in the form of a SiP.

FIG. 2A is a plan view of an RFID reader SiP in which an antenna is integrated, and FIG. 2B is a sectional view thereof. Referring to FIG. 2A, an antenna 202 is integrated on the top layer of the package and has a spiral shape. Meanwhile, as shown in FIG. 2B, the above-described conductors 204 and 206 for power and ground are disposed below the antenna 202. In this case, the power and ground conductors 204 and 206 negatively influence the antenna 202 in such a way that an electric field and a magnetic field are induced on the conductors 204 and 206, and thus eddy current is generated.

Therefore, in order to decrease the influence between the conductors 204 and 206 and the antenna 202, a structure in which magnetic material, such as a ferrite 208, is interposed between the antenna 202 and the conductors 204 and 206 has been proposed. However, a package having such a structure is also problematic in that the operating characteristics desired by the antenna cannot be exhibited in simulation and measurement, and the size of the package is increased.

Figure 3A:
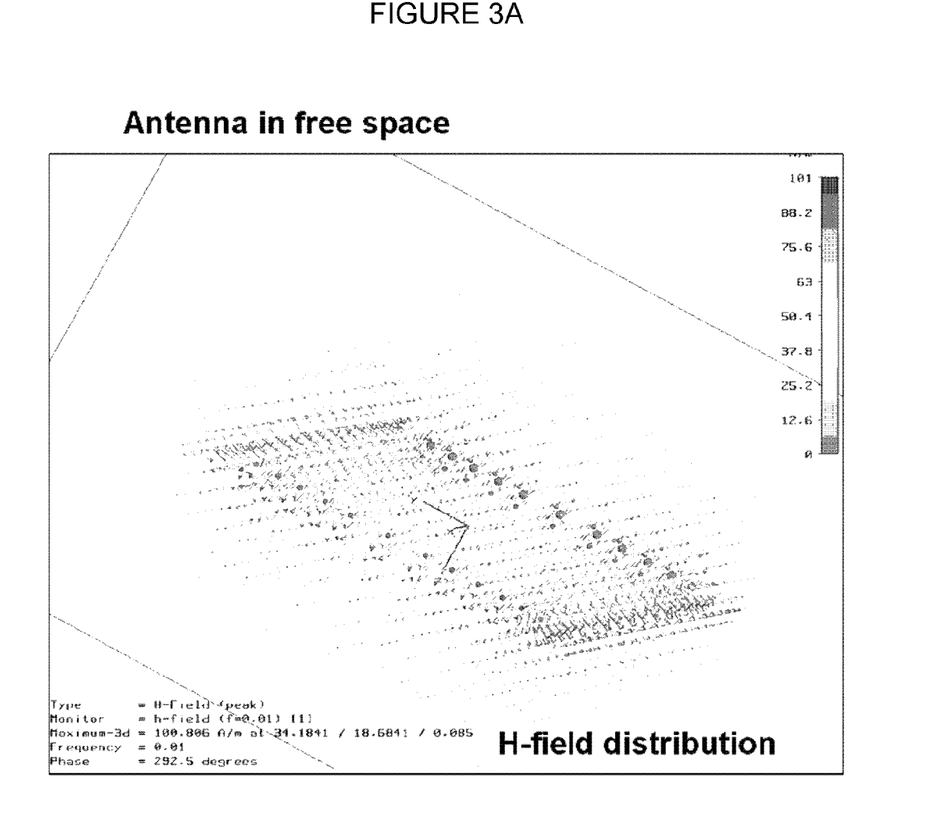
FIGS. 3A and 3B are views showing comparison results obtained through the simulation of the influence on the antenna in a conventional RFID reader SiP, in which the antenna is integrated.
Figure 3B:
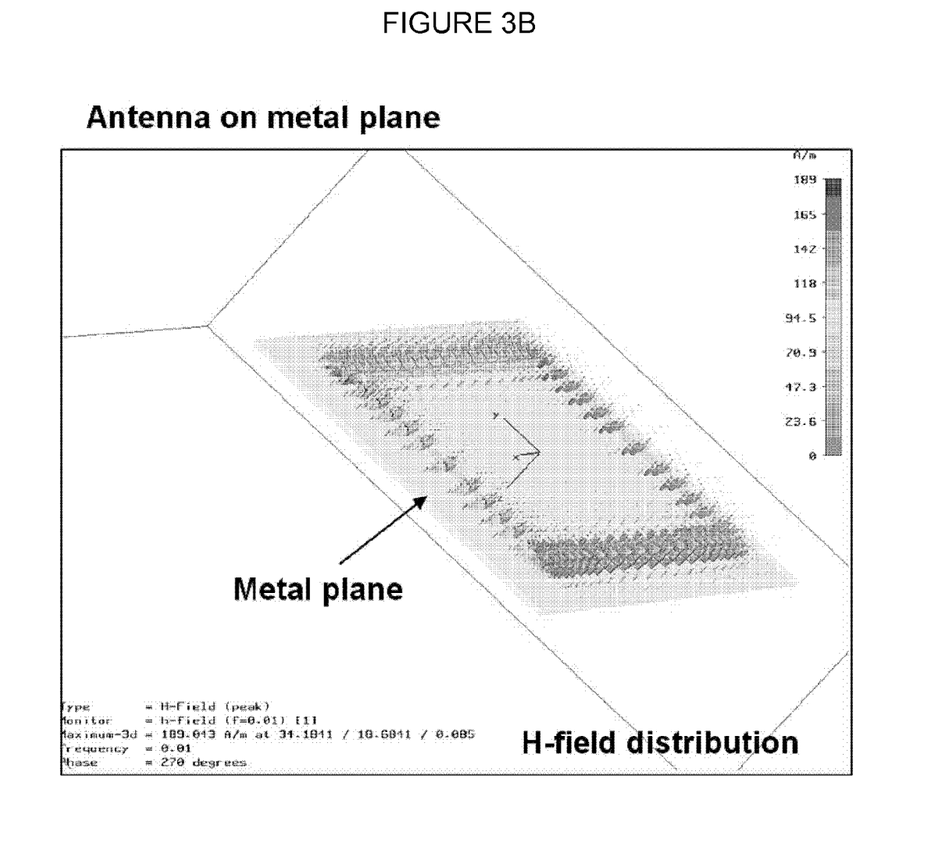

FIGS. 3A and 3B are views showing comparison results obtained through the simulation of the influence on the antenna in a conventional RFID reader SiP, in which the antenna is integrated.

FIG. 3A illustrates magnetic flux density distribution, which is the result of the simulation of an antenna in a free space, and FIG. 3B illustrates magnetic flux density distribution obtained when a metal plane is disposed below the antenna.

When the antenna is disposed in a free space, as shown in FIG. 3A, it can be seen that the magnetic flux density is regularly distributed above and below the antenna. However, when the metal plane is disposed below the antenna, as shown in FIG. 3B, the antenna on the metal plane is influenced by the metal plane, so that the magnetic flux density is strongly distributed only in the direction in which the metal plane is placed, and thus the characteristics of the antenna, which must have excellent radiation characteristics, are deteriorated. That is, it can be seen that, when an antenna is integrated in a package, a conductor plane placed below the antenna very negatively influences the operating characteristics of the antenna.

Therefore, a package design method for preventing an influence from being exerted on an antenna that is integrated in the package, as a result of the design itself of the package, is required, in addition to the insertion of magnetic material, such as a ferrite.

SUMMARY OF THE INVENTION

Accordingly, the present invention has been made keeping in mind the above problems occurring in the prior art, and an object of the present invention is to provide a SiP having reduced influence between a conductor and an antenna, which can minimize an electromagnetic field induced on a planar conductor in a SiP in which the antenna is integrated, thus reducing the influence of the conductor on antenna characteristics.

In accordance with one aspect of the present invention to accomplish the above object, there is provided a System-in-Package (SiP) having a reduced influence between a conductor and an antenna, comprising an antenna configured to function to transmit or receive data and mounted in the SiP to be integrated in the SiP; and a first planar conductor having at least one slit formed therein.

In accordance with another aspect of the present invention to accomplish the above object, there is provided a planar conductor for a System-in-Package (SiP), comprising at least one slit formed therein to reduce current or an electromagnetic field induced on the conductor by current or an electromagnetic field of an antenna integrated in the SiP.

In accordance with a further aspect of the present invention to accomplish the above object, there is provided a method of designing a System-in-Package (SiP) having a reduced influence between a conductor and an antenna, comprising forming at least one slit in a first planar conductor included in the SiP to reduce current or an electromagnetic field induced on the conductor by current or an electromagnetic field of the antenna integrated in the SiP.

In accordance with yet another aspect of the present invention to accomplish the above object, there is provided a System-in-Package (SiP) having a reduced influence between a conductor and an antenna, comprising an antenna configured to function to transmit or receive data and mounted in the SiP to be integrated in the SiP; and a layer for supplying power or providing ground through a linear conductor.

In accordance with still another aspect of the present invention to accomplish the above object, there is provided a method of designing a System-in-Package (SiP) having a reduced influence between a conductor and an antenna, comprising allowing power to be supplied or ground to be provided into the SiP through a linear conductor.

In accordance with still another aspect of the present invention to accomplish the above object, there is provided a System-in-Package (SiP) having reduced influence between a conductor and an antenna, comprising an antenna configured to function to transmit or receive data and mounted in the SiP to be integrated in the SiP; and a planar conductor having a cutout formed therein at a feeding point of the antenna.

In accordance with still another aspect of the present invention to accomplish the above object, there is provided a method of designing a System-in-Package (SiP) having a reduced influence between a conductor and an antenna, comprising forming a cutout in a planar conductor, included in the SiP, at a feeding point of an antenna integrated in the SiP.

BRIEF DESCRIPTION OF THE DRAWINGS

The above and other objects, features and other advantages of the present invention will be more clearly understood from the following detailed description taken in conjunction with the accompanying drawings, in which.

DESCRIPTION OF THE PREFERRED EMBODIMENTS

Hereinafter, embodiments of the present invention will be described in detail with reference to the attached drawings. Reference now should be made to the drawings, in which the same reference numerals are used throughout the different drawings to designate the same or similar components. Further, detailed descriptions may be omitted if it is determined that the detailed descriptions of related well-known functions and construction may make the gist of the present invention unclear.

Figure 4A:
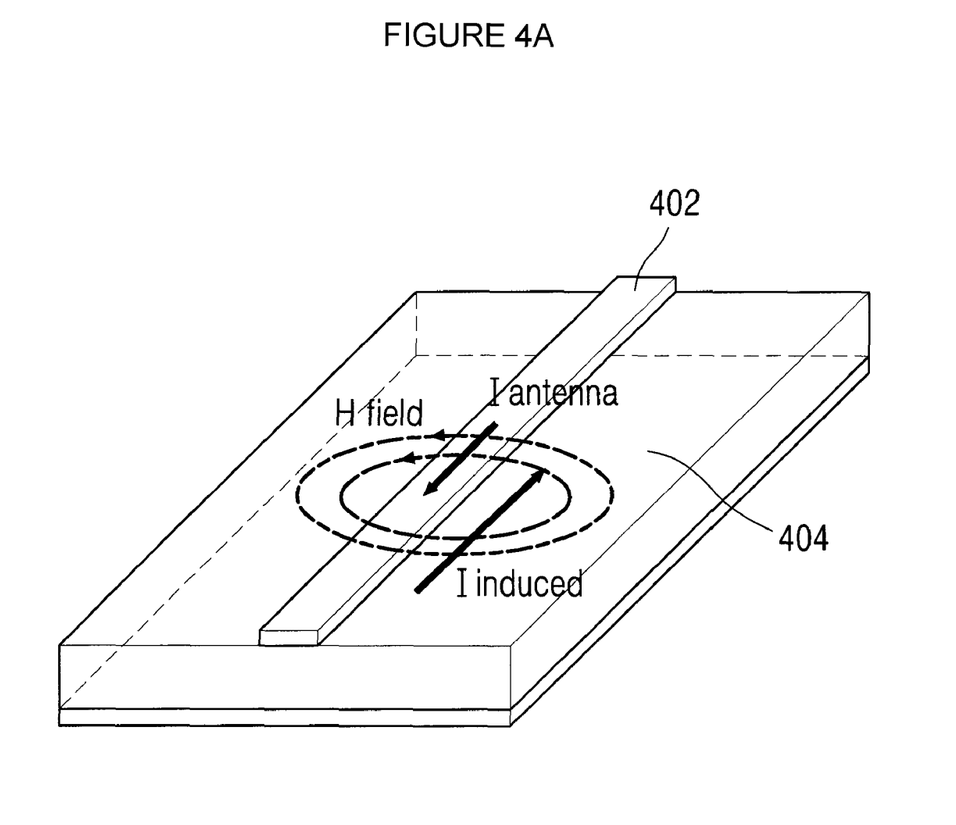
FIGS. 4A and 4B are views showing a mechanism in which an antenna induces current on a conductor in a conventional SiP.
Figure 4B:
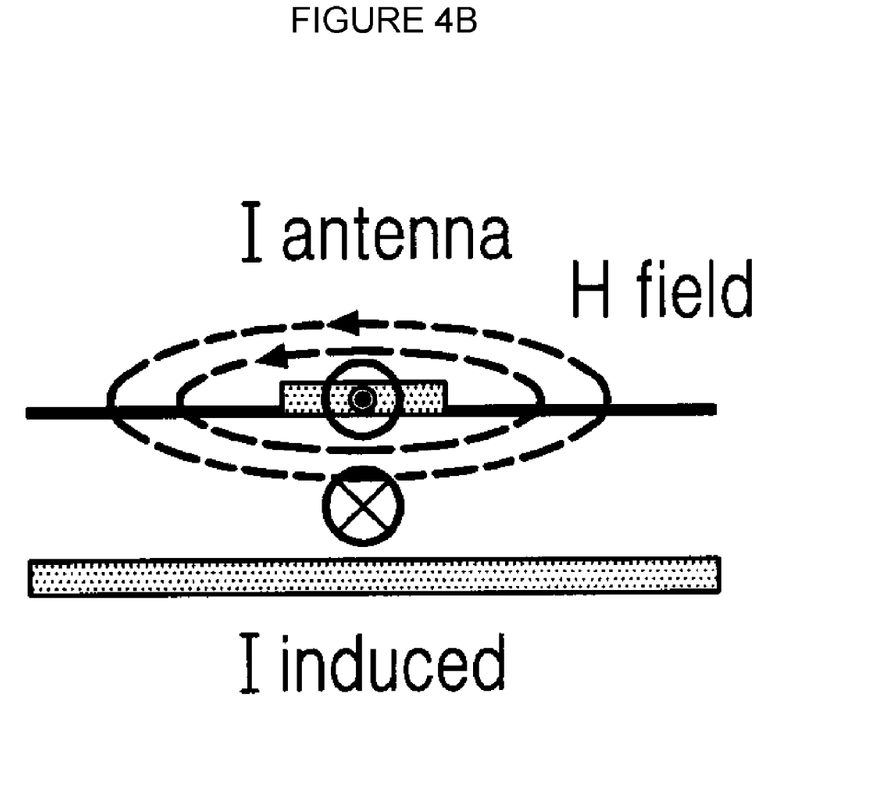

FIGS. 4A and 4B are views showing a mechanism in which an antenna induces current on a conductor in a conventional SiP.

FIG. 4A shows the case where an antenna 402 is placed on the top surface of a SiP package, and a planar conductor 404 is placed below the antenna 402 when current Iantenna flows through the antenna 402.

In this case, a magnetic flux density (H-field) is induced in the direction indicated in the drawing by the current Iantenna flowing through the antenna 402 depending on the direction of the current Iantenna. The magnetic flux density induces current Iinduced on the planar conductor 404, placed below the antenna, in the direction indicated in the drawing. The directivity, in which the current Iinduced is induced, is obtained by Maxwell's equation, which is a basic equation in the electromagnetic field, and is shown in FIG. 4B in a sectional view.

In this way, electromagnetic waves radiated from the antenna induce eddy current on the conductor, and thus negatively influence the performance of the antenna. Accordingly, there is a need to prevent the current induced by the antenna.

Figure 5:
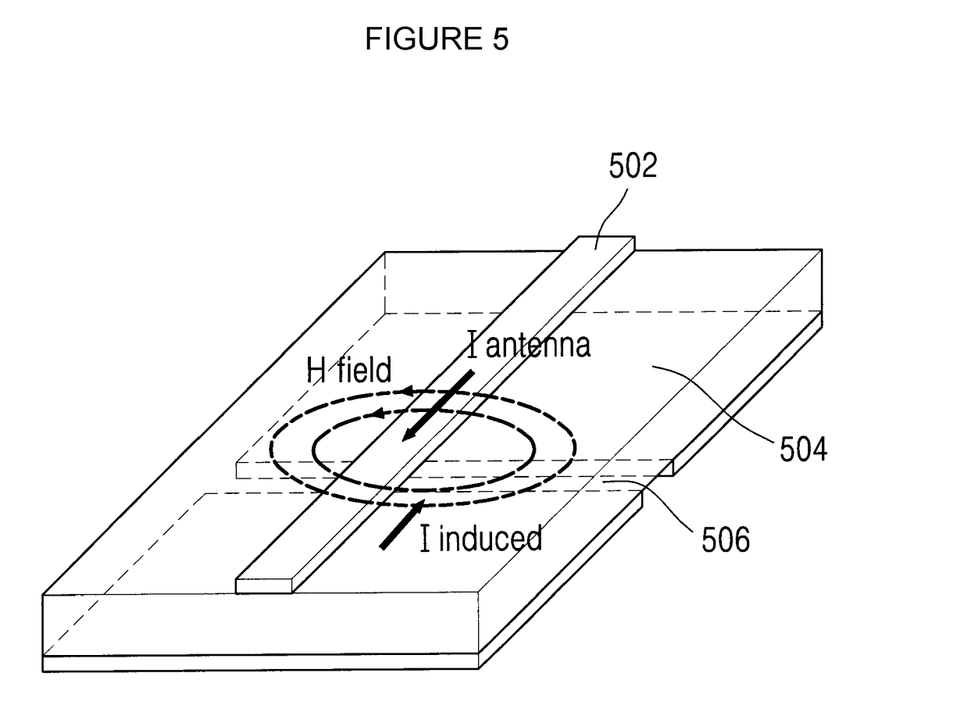
FIG. 5 is a view showing a structure in which current, induced by an antenna, is cut off by a slit formed in a conductor in a SiP according to an embodiment of the present invention.

FIG. 5 is a view showing a structure in which current induced by an antenna is cut off by a slit formed in a conductor in a SiP according to an embodiment of the present invention.

Referring to FIG. 5, a magnetic flux density (H-field) is induced by current I-antenna flowing through an antenna 502, similar to FIG. 4A, and then induces current Iinduced on a planar conductor 504 placed below the antenna 502. However, when a slit 506 is formed in the planar conductor 504, as shown in FIG. 5, the current Iinduced on the planar conductor 504 is cut off by the slit 506, thus decreasing the magnitude of the induced current Iinduced.

That is, the induced current Iinduced is cut off by the slit 506 formed in the planar conductor 504, and is formed to be smaller than that of the case in which no slit is formed, as shown in FIG. 4A. In this case, the direction in which the slit is formed in the planar conductor 504 may be preferably taken to be perpendicular to the direction of current flowing through the antenna 502, as shown in FIG. 5.

Figure 6A:
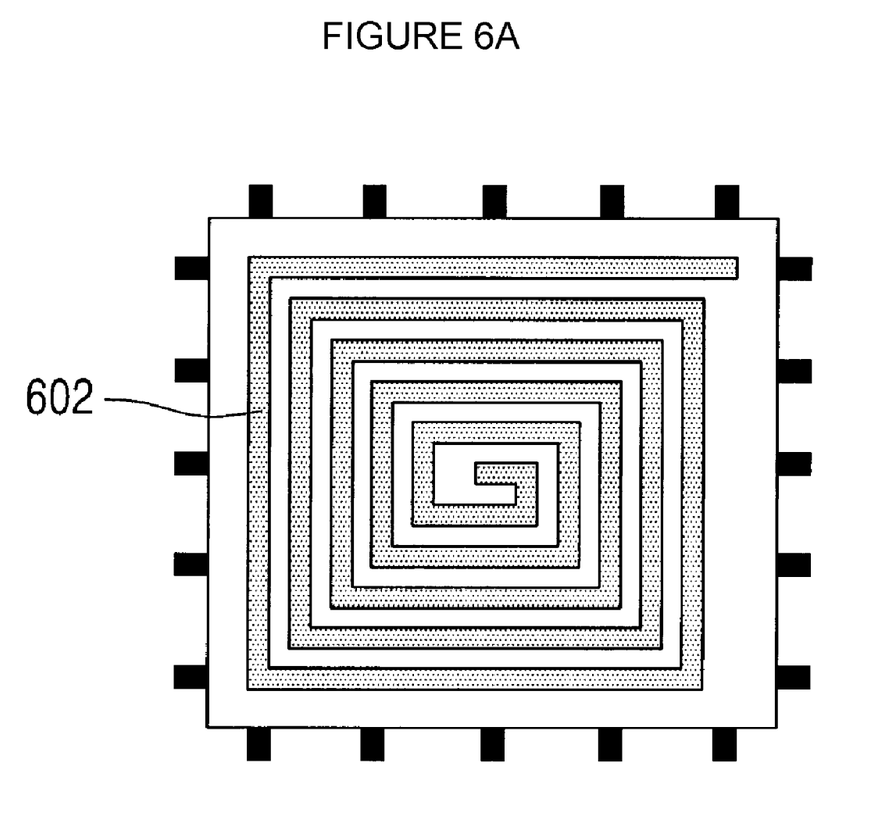
FIGS. 6A and 6B are views showing an antenna and a conductor having slits formed therein in a SiP according to an embodiment of the present invention.
Figure 6B:
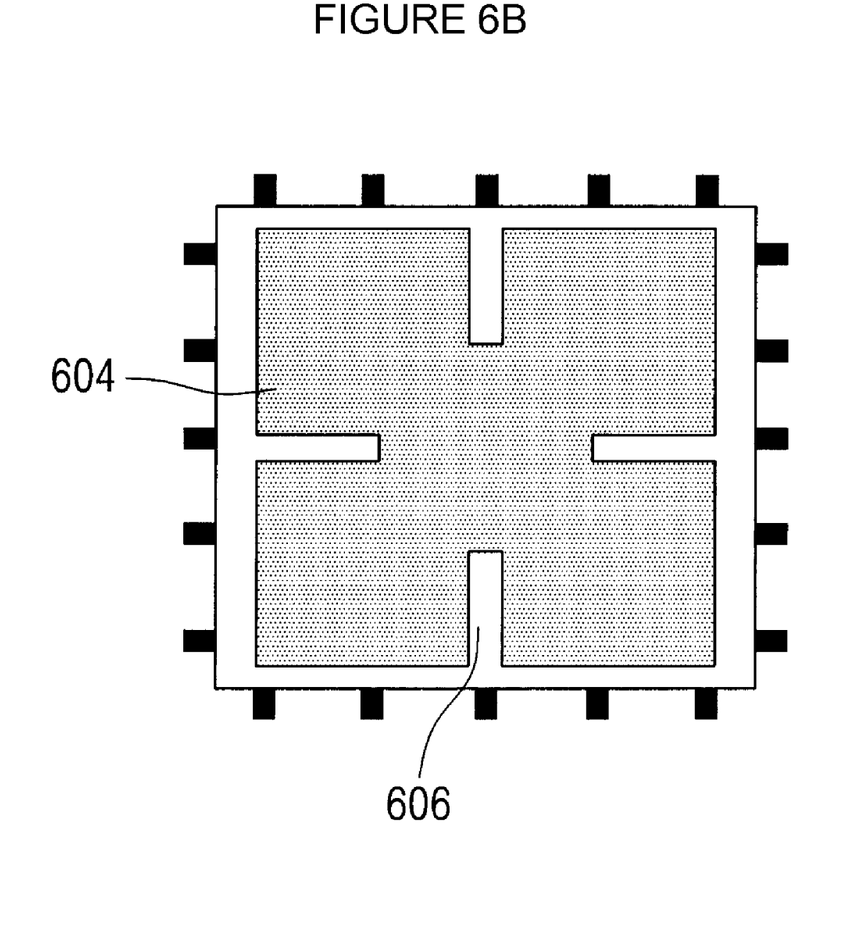

FIGS. 6A and 6B are views showing an antenna and a conductor having slits formed therein in a SiP according to an embodiment of the present invention.

FIG. 6A illustrates an antenna 602 integrated in a SiP. In FIG. 6A, the antenna 602 is integrated and has a spiral shape. Moreover, antennas having various shapes can be formed.

FIG. 6B illustrates slits 606 formed in a planar conductor 604 in a SiP. Referring to FIGS. 6A and 6B, the slits 606 are formed in the shape of a plus sign without a central portion to be perpendicular to the direction of the current path of the antenna 602 so as to reduce induced current. Of course, the shape of the slits shown in FIG. 6B is only an example, and it will be apparent to those skilled in the art that various modifications are possible. That is, the shape and number of slits can be determined in various forms depending on the shape of the antenna included in the SiP.

Figure 7A:
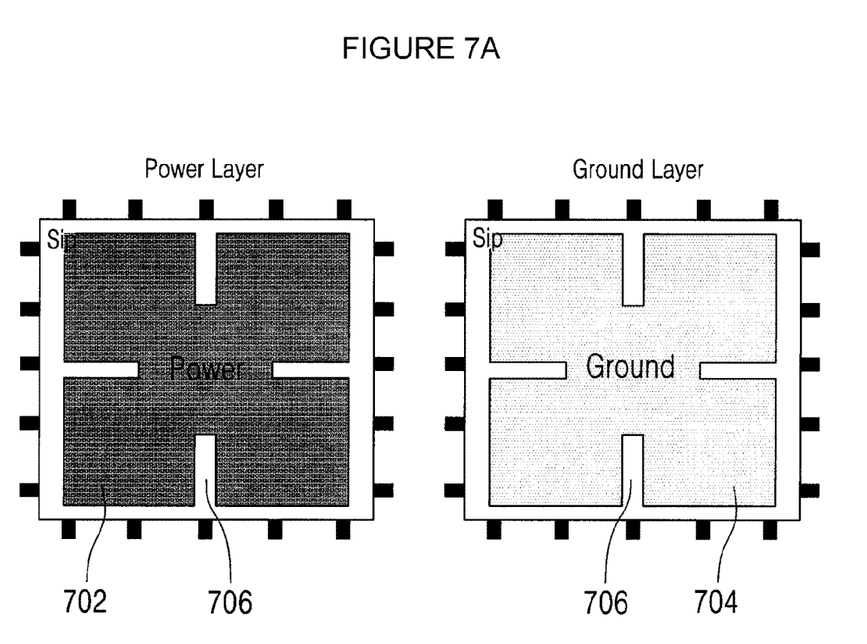
FIGS. 7A and 7B are views showing conductors, having slits symmetrically and asymmetrically formed therein, in a SiP according to an embodiment of the present invention.
Figure 7B:
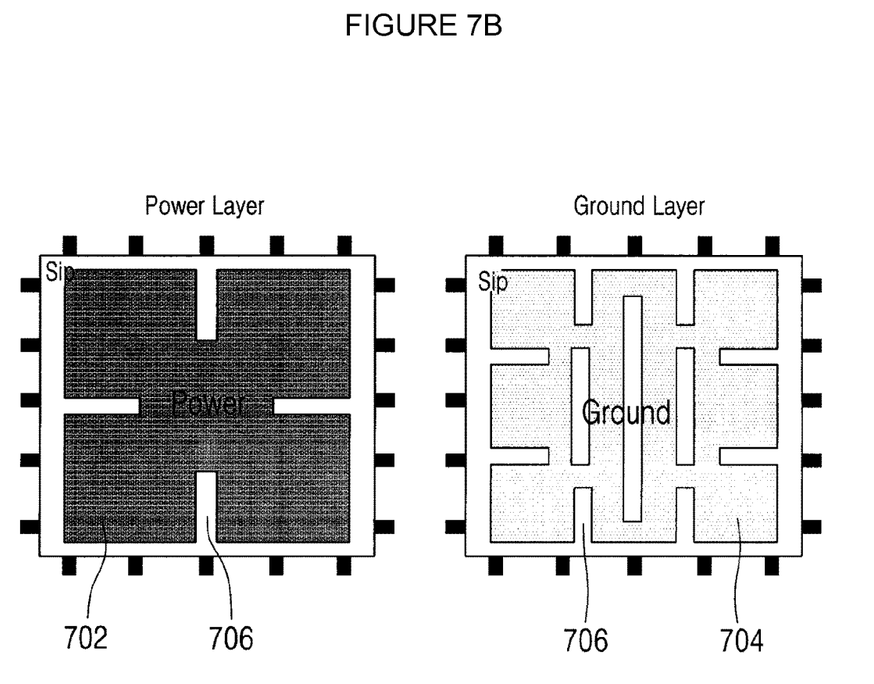

FIGS. 7A and 7B are views showing conductors, having slits symmetrically or asymmetrically formed therein, in a SiP according to an embodiment of the present invention.

FIG. 7A illustrates the case where slits 706 are symmetrically formed in the conductors 702 and 704 of a SiP according to an embodiment of the present invention. For example, as shown in FIG. 7A, the plus sign-shaped slits 706 may be symmetrically formed in planar conductors 702 and 704, respectively formed on a power layer for supplying power and a ground layer for providing ground. When slits are symmetrically formed in this way, current induced by the antenna can be cut off double.

FIG. 7B illustrates the case where slits 706 are asymmetrically formed in conductors 702 and 704 in a SiP according to an embodiment of the present invention. For example, as shown in FIG. 7B, slits 706, having the shape of a plus sign without a central portion, can be formed in the conductor 702 on a power layer, and slits 706 can be formed in the conductor 704 on a ground layer in shapes other than the shape of a plus sign without a central portion. When the slits are asymmetrically formed in this way, a complementary effect can be expected to enable induced current, which cannot be sufficiently cut off by the slits of any one conductor, to be completely cut off by the slits of the remaining conductor.

Figure 8:
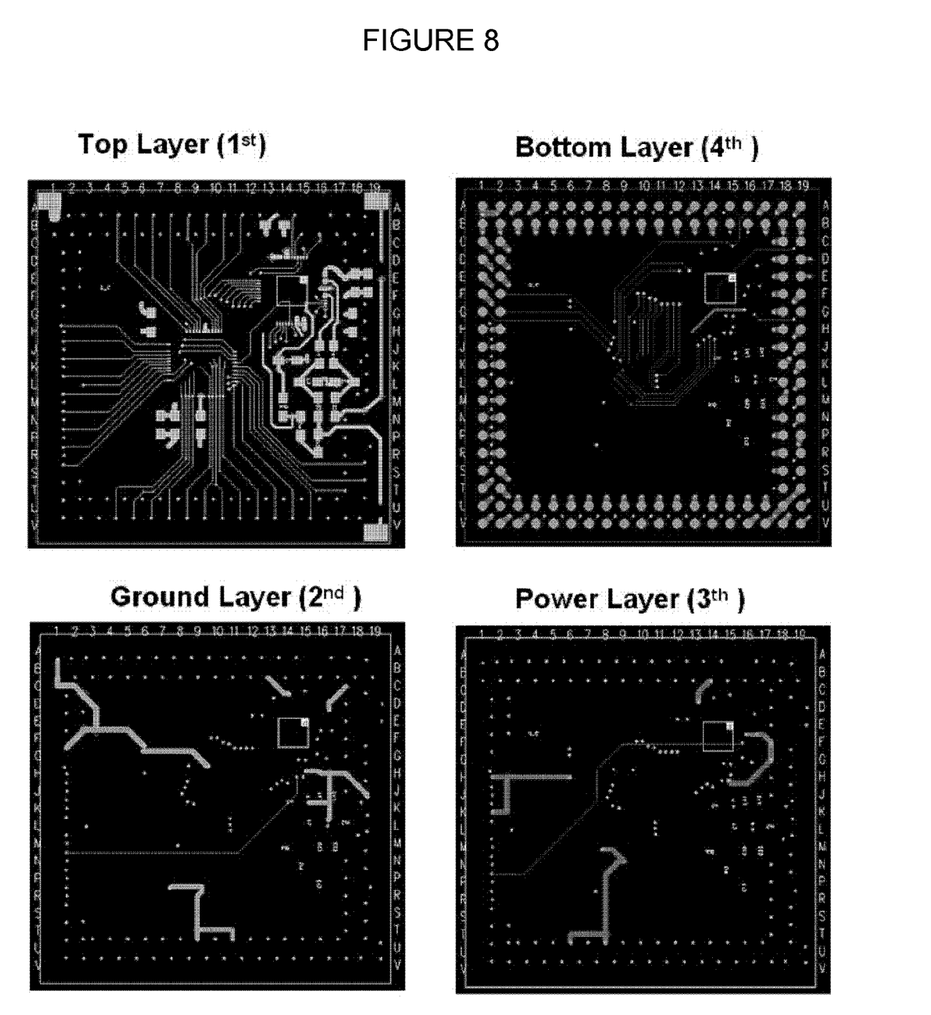
FIG. 8 is a view showing a structure in which power and ground are supplied in a linear shape in a SiP according to an embodiment of the present invention.

FIG. 8 is a view showing a structure in which power and ground are supplied in a linear shape in a SiP according to an embodiment of the present invention.

As described above, it can be seen that a planar conductor placed in a SiP very badly influences the operating characteristics of an antenna, as shown in FIGS. 3A and 3B, and that the operating characteristics of the antenna are excellent when the planar conductor is completely removed. Therefore, the removal of the planar conductor may be the best solution, but, if the planar conductor cannot be completely removed, a conductor may be formed in a linear shape, rather than a planar shape, thus decreasing the influence of the conductor on the antenna.

Referring to FIG. 8, it can be seen that all planar conductors placed on power and ground layers are removed, and only required parts of the conductors are formed in linear shapes, and thus power and ground are supplied.

Figure 9:
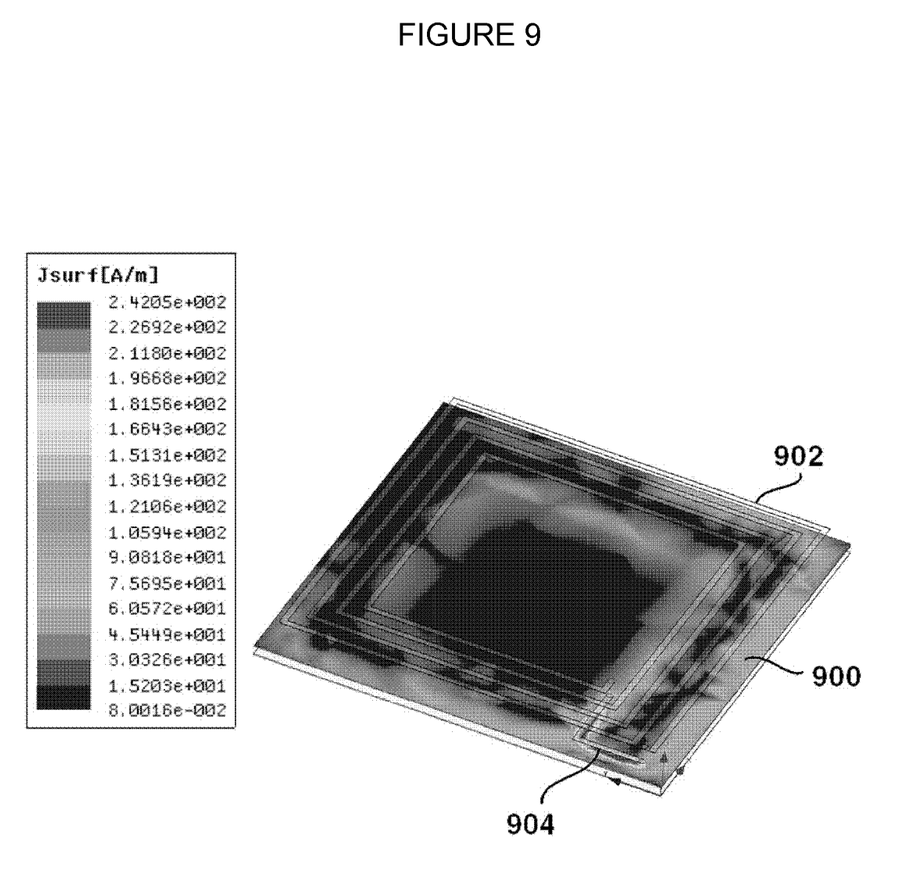
FIG. 9 is a view showing the distribution of the magnitude of surface current induced by an antenna on a conductor in a conventional SiP.

FIG. 9 is a view showing the distribution of the magnitude of surface current induced by an antenna on a conductor in a conventional SiP.

Referring to FIG. 9, the distributions of magnitudes of surface currents, induced by electromagnetic waves radiated from an antenna 902 on the surface of a planar conductor 900, when the planar conductor 900 is placed below the antenna 902 integrated in a SiP, are indicated by different colors. As shown in FIG. 9, the portion most influenced by the electromagnetic waves attributable to the antenna 902 (red portion) is the feeding point 904 of the antenna 902. Therefore, a method of sufficiently decreasing the influence of induced current around the feeding point 904 is required, and is described with reference to FIGS. 10A and 10B.

Figure 10A:
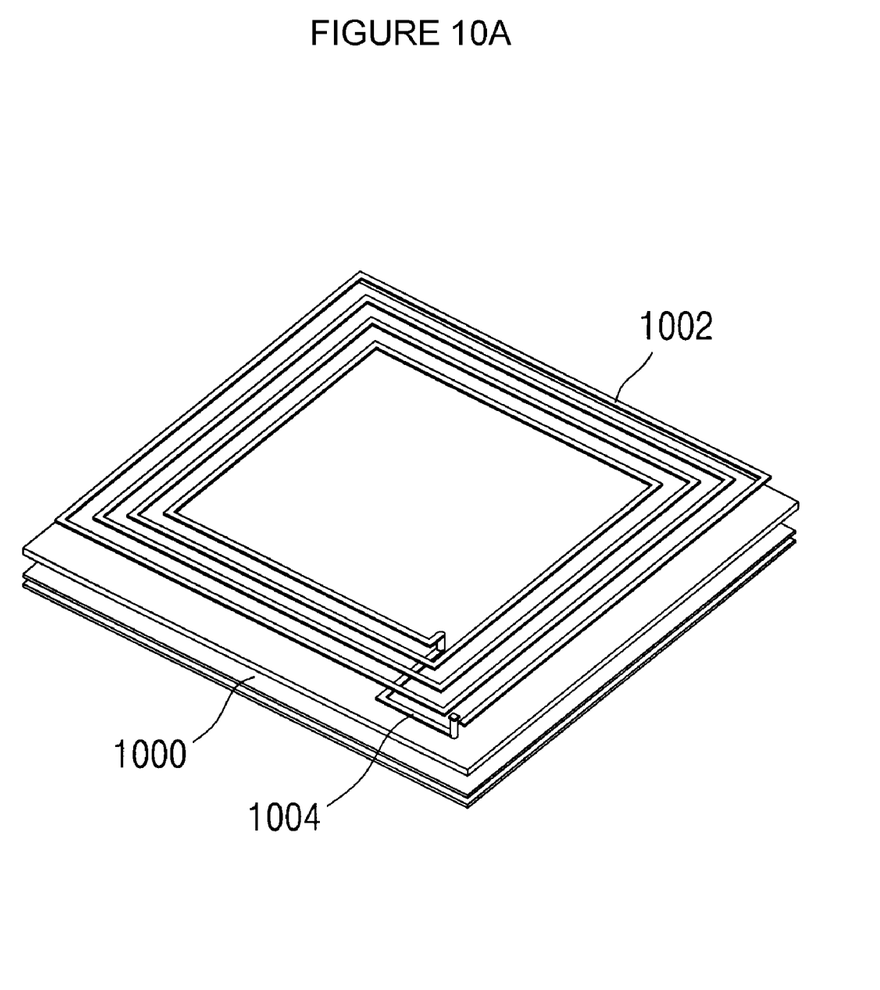
FIGS. 10A and 10B are views showing the formation of a cutout in a conductor in a SiP according to an embodiment of the present invention.
Figure 10B:
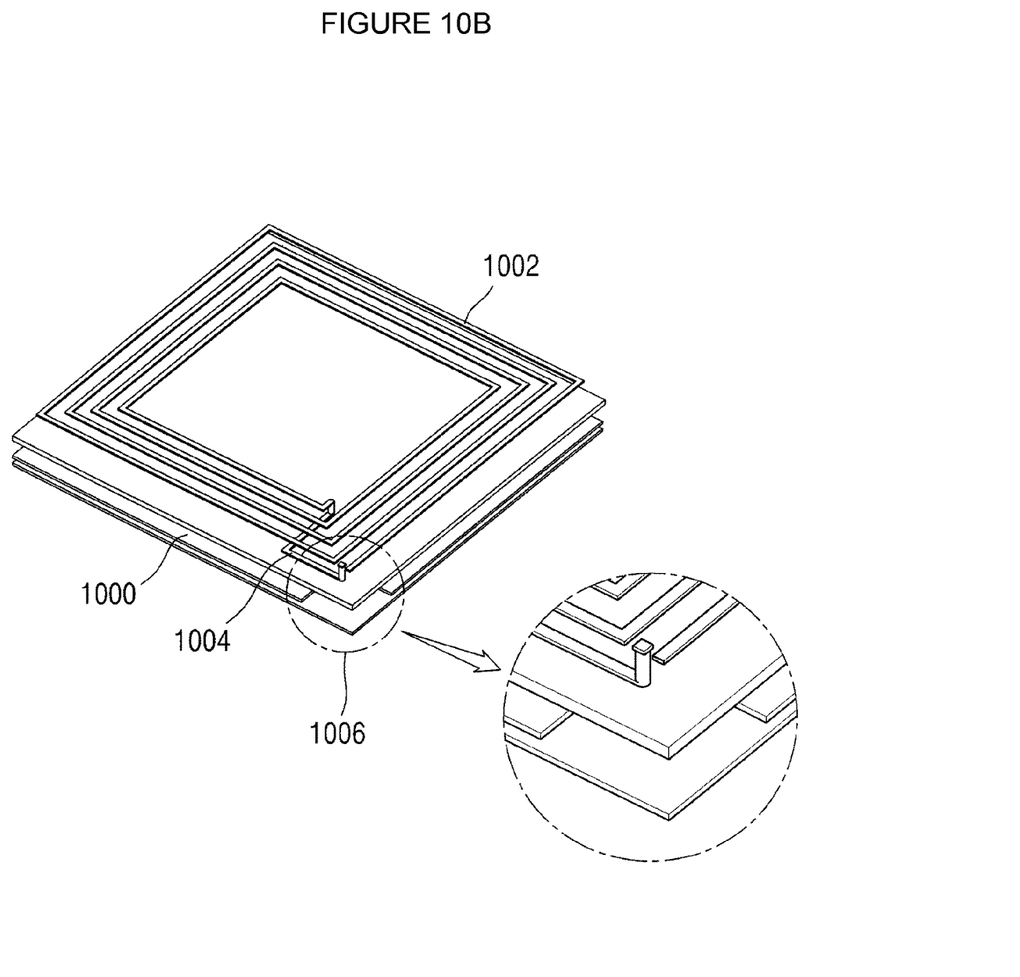

FIGS. 10A and 10B are views showing the formation of a cutout in a conductor in a SiP according to an embodiment of the present invention.

Referring to FIG. 10A, a planar conductor 1000 is placed below an antenna 1002 integrated in a SiP, and a feeding point 1004 is connected to the antenna 1002.

As described above with reference to FIG. 9, since the influence of induced current is greatly exerted around the feeding point 1004 of the antenna 1002, it will be efficient to eliminate part of the conductor 1000 present around the feeding point 1004. Therefore, part of the conductor 1000 present around the feeding point 1004 is cut away, that is, a cutout is formed, and thus the influence of the induced current around the feeding point 1004 can be decreased.

FIG. 10B shows that a cutout 1006 is formed in a conductor 1000 near the feeding point 1004. In FIG. 10B, the corner of the conductor 1000 is cut away to form the cutout, but it will be apparent that this structure is only an example, and that the shape and size of the cutout can be variously modified.

Meanwhile, in the SiP according to the embodiments of the present invention, described with reference to FIGS. 6 to 10, an example in which both a slit and a cutout can be formed together in the conductor so as to decrease the influence of induced current can be presented as another embodiment of the present invention, wherein the application of both a slit and a cutout is obvious, and thus a detailed description thereof is omitted.

Although the preferred embodiments of the present invention have been disclosed for illustrative purposes, those skilled in the art will appreciate that various modifications, additions and substitutions are possible, without departing from the scope and spirit of the invention as disclosed in the accompanying claims. Therefore, the embodiments disclosed in the present invention are not intended to limit the technical spirit of the present invention, but are intended to describe the invention. The technical spirit of the present invention is not limited to such embodiments. The scope of the present invention must be defined by the following claims, and all equivalents thereof should be interpreted as being included in the technical spirit and scope of the present invention.

According to the SiP having reduced influence between a conductor and an antenna, and a method of designing the SiP, there are advantages in that a slit or a cutout is formed in the planar conductor of the SiP, or alternatively a conductor is formed in a linear shape, rather than a planar shape, so that the amount of current or the electromagnetic field induced on the conductor by the electromagnetic field of the antenna is minimized, thus greatly decreasing the influence of the conductor on the operating characteristics of the antenna.

What is claimed is:

1. A System-in-Package (SiP) having reduced influence between a conductor and an antenna, comprising:
    an antenna configured to function to transmit or receive data and mounted in the SiP to be integrated in the SiP; and
    a planar conductor having a cutout formed directly under a feeding point of the antenna,
    wherein the cutout is formed to reduce current or an electromagnetic field induced on the conductor by current or an electromagnetic field of the antenna.

2. The SiP according to claim 1, wherein the conductor has at least one slit formed therein to reduce current or an electromagnetic field induced on the conductor by current or an electromagnetic field of the antenna.

3. A method of designing a System-in-Package (SiP) having a reduced influence between a conductor and an antenna, comprising:
    forming a cutout in a planar conductor, included in the SiP, directly under a feeding point of an antenna integrated in the SiP,
    wherein the cutout is formed to reduce current or an electromagnetic field induced on the conductor by current or an electromagnetic field of the antenna.

4. The method according to claim 3, further comprising forming at least one slit in the conductor to reduce current or an electromagnetic field induced on the conductor by current or an electromagnetic field of the antenna.

* * * * *